United States Patent
Bohra et al.

(10) Patent No.: US 11,742,001 B2
(45) Date of Patent: Aug. 29, 2023

(54) CONFIGURABLE MULTIPLEXING CIRCUITRY

(71) Applicant: Arm Limited, Cambridge (GB)

(72) Inventors: Fakhruddin Ali Bohra, Austin, TX (US); Lalit Gupta, Cupertino, CA (US); Shri Sagar Dwivedi, San Jose, CA (US)

(73) Assignee: Arm Limited, Cambridge (GB)

( * ) Notice: Subject to any disclaimer, the term of this patent is extended or adjusted under 35 U.S.C. 154(b) by 11 days.

(21) Appl. No.: 16/860,764

(22) Filed: Apr. 28, 2020

(65) Prior Publication Data

US 2021/0335397 A1    Oct. 28, 2021

(51) Int. Cl.
*G11C 7/10* (2006.01)

(52) U.S. Cl.
CPC .......... *G11C 7/1012* (2013.01); *G11C 7/1039* (2013.01); *G11C 7/1045* (2013.01); *G11C 7/1051* (2013.01); *G11C 7/1078* (2013.01)

(58) Field of Classification Search
CPC ... G11C 7/1012; G11C 7/1078; G11C 7/1045; G11C 7/1039; G11C 7/1051; G11C 7/1018; G11C 7/103
See application file for complete search history.

(56) References Cited

U.S. PATENT DOCUMENTS

| | | | |
|---|---|---|---|
| 6,184,712 B1 * | 2/2001 | Wittig | H03K 19/17728 326/39 |
| 6,212,615 B1 * | 4/2001 | Takahashi | G11C 7/1021 711/219 |
| 6,407,961 B1 * | 6/2002 | Perets | G11C 7/1006 365/230.02 |
| 7,239,558 B1 * | 7/2007 | Poplevine | G11C 14/00 365/187 |
| 9,711,243 B1 * | 7/2017 | Nautiyal | G11C 29/842 |
| 2001/0013793 A1 * | 8/2001 | Rangasayee | H03K 19/17736 326/40 |
| 2003/0217314 A1 * | 11/2003 | Park | G11C 29/36 714/720 |
| 2004/0240283 A1 * | 12/2004 | Tellier | G11C 29/00 365/200 |

(Continued)

OTHER PUBLICATIONS

PCT International Search Report and Written Opinion; PCT/GB2021/050957; dated Jun. 23, 2021.

(Continued)

*Primary Examiner* — Jay W. Radke
(74) *Attorney, Agent, or Firm* — Pramudji Law Group PLLC; Ari Pramudji

(57) ABSTRACT

Various implementations described herein are related to a device having memory circuitry having an array of memory cells. The device may include output circuitry coupled to the memory circuitry, and the output circuitry may have a first set of multiplexers that receives column data from the array of memory cells and provides first multiplexed output data. The device may include output interface circuitry coupled to the output circuitry, and the output interface circuitry may have a second set of multiplexers that receives the first multiplexed output data from the output circuitry and selectively provides second multiplexed output data based on a configurable mode of multiplexed operation.

19 Claims, 8 Drawing Sheets

(56) References Cited

U.S. PATENT DOCUMENTS

| | | | |
|---|---|---|---|
| 2009/0103373 A1* | 4/2009 | Shau | G11C 7/1066 |
| | | | 365/189.02 |
| 2009/0103387 A1* | 4/2009 | Shau | G11C 5/04 |
| | | | 29/829 |
| 2010/0034029 A1* | 2/2010 | Xiong | G11C 11/419 |
| | | | 365/194 |
| 2010/0329066 A1 | 12/2010 | Chin | |
| 2015/0029773 A1* | 1/2015 | Holla | G11C 5/025 |
| | | | 29/25.01 |
| 2018/0005692 A1* | 1/2018 | Jung | G11C 11/418 |
| 2019/0237111 A1* | 8/2019 | Nautiyal | G11C 7/18 |
| 2019/0267049 A1* | 8/2019 | Asthana | G11C 16/04 |
| 2021/0110851 A1* | 4/2021 | Gupta | G11C 11/419 |

OTHER PUBLICATIONS

Guido, et al.; A4 Mb LV MOS-Selected Embedded Phase Change Memory in 90 mm Standard CMOS Technology; IEEE International Solid-State Circuits; vol. 46, No. 1; pp. 52-63; Jan. 2011.

Guo, et al.; A Scalable 2 V, 20 GHz FPGA SlGe usin HBT BiCMOS Technology; Proceedings of the 2003 ACM/SIGDA eleventh international symposium on Field programmable gate arrays; pp. 145-153; Feb. 2003.

\* cited by examiner

Q_Output Truth Table 302

| | M8_en | M16_en | CA2 | CA3 | Q0_ext | Q1_ext | Q2_ext | Q3_ext |
|---|---|---|---|---|---|---|---|---|
| M16 | x | 1 | 0 | 0 | 0 | 0 | Q2 | 0 |
| | x | 1 | 0 | 1 | 0 | 0 | Q3 | 0 |
| | x | 1 | 1 | 0 | 0 | 0 | Q1 | 0 |
| | x | 1 | 1 | 1 | 0 | 0 | Q0 | 0 |
| M8 | 1 | 0 | 0 | 0 | 0 | Q1 | Q2 | 0 |
| | 1 | 0 | 1 | 0 | 0 | Q0 | Q3 | 0 |
| M4 | 0 | 0 | 0 | 0 | Q0 | Q1 | Q2 | Q3 |

FIG. 3

D_Input Truth Table 702

| | M8_en | M16_en | CA2 | CA3 | D0 | D1 | D2 | D3 |
|---|---|---|---|---|---|---|---|---|
| M16 | x | 1 | 0 | 0 | float | float | D2_ext | float |
| | x | 1 | 0 | 1 | float | D1_ext | float | float |
| | x | 1 | 1 | 0 | float | float | float | D3_ext |
| | x | 1 | 1 | 1 | D0_ext | float | float | float |
| M8 | 1 | 0 | 0 | 0 | float | D1_ext | D2_ext | float |
| | 1 | 0 | 1 | 0 | D0_ext | float | float | D3_ext |
| M4 | 0 | 0 | 0 | 0 | D0_ext | D1_ext | D2_ext | D3_ext |

1
CONFIGURABLE MULTIPLEXING CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some memory architecture designs, conventional multiplexing logic may not be efficient when expanding to higher orders of multiplexing operations. In reference to external control logic, high performance multiplexing operations may be difficult to achieve with conventional memory designs, which are typically designed to implement features or practices that respond to and mitigate specific types of delays and/or failures. Thus, there exists a need to improve multiplexing logic designs for memory applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 3 illustrates a diagram of an output truth table in accordance with various implementations described herein.

FIG. 7 illustrates a diagram of an input truth table in accordance with various implementations described herein.

DETAILED DESCRIPTION

Various implementations described herein refer to selectively configurable and flexible multiplexing schemes and techniques for memory applications. For instance, the various schemes and techniques described herein may provide for flexible muxing options in given memory macros that provide for multiple multiplexer capabilities within the same memory macro. Also, in various implementations, sizing of the multiplexer capabilities is selectively scalable for different sized memory macros. In some implementations, various schemes and techniques described herein may provide for optimizing existing memory designs using a base multiplexer option, such as, e.g., mux4 that may be expanded to include mux8, mux16, or larger. In some

2 implementations, the same logic depth may be maintained for each multiplexer output, which may maintain the same timing. Further, redundant Q outputs may be coupled to logic zero (log 0) to avoid floating outputs.

Various implementations of configurable multiplexing schemes and techniques will be described in detail herein with reference to FIGS. 1-8.

Figure 1:
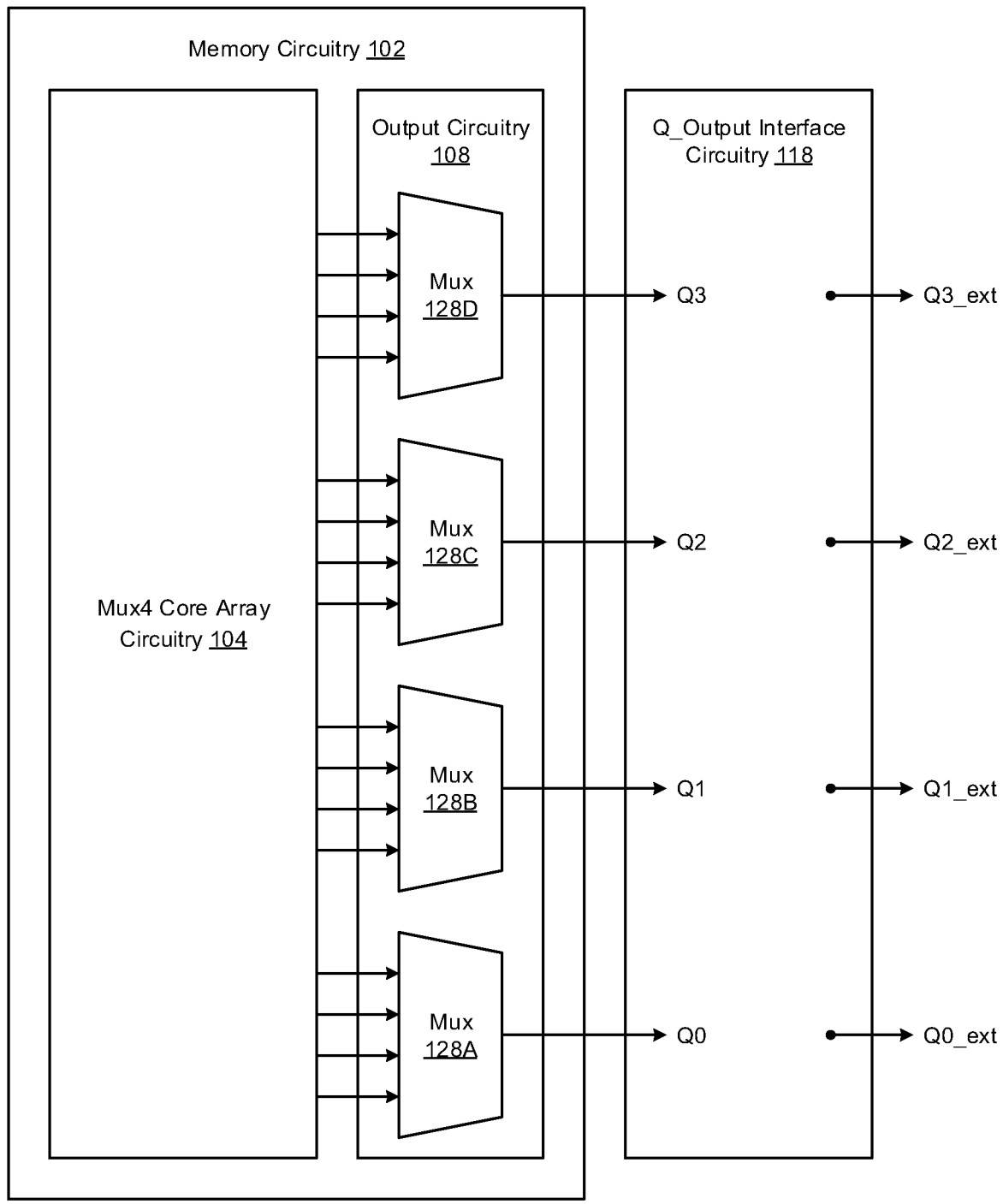
FIG. 1 illustrates a diagram of memory circuitry with output interface circuitry in accordance with various implementations described herein.

FIG. 1 illustrates a diagram 100 of memory circuitry 102 with output interface circuitry 118 in accordance with various implementations described herein.

In various implementations, the memory circuitry 102 may be implemented as a system or a device having various integrated circuit (IC) components that are arranged and coupled together as an assemblage or combination of parts that provide for a physical circuit design and related structures. In some instances, a method of designing, providing and building the memory circuitry 102 as an integrated system or device that may involve use of various IC circuit components described herein so as to thereby implement various configurable multiplexing techniques associated therewith. The memory circuitry 102 may be integrated with computing circuitry and related components on a single chip, and the memory circuitry 102 may be implemented in various embedded systems for automotive, electronic, mobile and Internet-of-things (IoT) applications.

As shown in FIG. 1, the memory circuitry 102 may include core array circuitry 104 having an array of memory cells (or bitcells) arranged in columns and rows. In some instances, the memory circuitry 102 may include mux4 core array circuitry, and also, the memory circuitry 102 may refer to mux4 memory circuitry having the core array of memory cells 104 configured to provide column data to the output circuitry 108. In some instances, each memory cell in the core array 104 may be referred to as a bitcell, wherein each bitcell may be configured to store at least one data bit value (e.g., a data value associated with logical '0' or '1'). Also, each row of bitcells in the core array 104 may include any number of memory cells arranged in various configurations, such as, e.g., a two-dimensional (2D) core array 104 having columns and rows of bitcells arranged in a 2D grid pattern. Also, each bitcell may be implemented with random access memory (RAM) circuitry, or some other type of volatile and/or non-volatile type memory. In some instances, each memory cell may include a multi-transistor static RAM (SRAM) cell, such as various types of SRAM cells, such as, e.g., 6T CMOS SRAM and/or other types of complementary MOS (CMOS) SRAM cells, such as, e.g., 4T, 8T, 10T, or more transistors per bit.

In some instances, the memory circuitry 102 may refer to memory architecture having the core array circuitry 104 along with column multiplexer circuitry, such as, e.g., output circuitry 108 that is coupled to the memory architecture via multiple bitlines for read access operations. Thus, the output circuitry 108 may be coupled to the memory circuitry 102, and the output circuitry 108 may include a first set of multiplexers (Mux 128A, 128B, 128C, 128D) that receives column data from the core array 104 of memory cells and also provides first multiplexed output data (e.g., Q0, Q1, Q2, Q3) to output interface circuitry 118, which may be referred to as Q_output interface circuitry.

Figure 2:
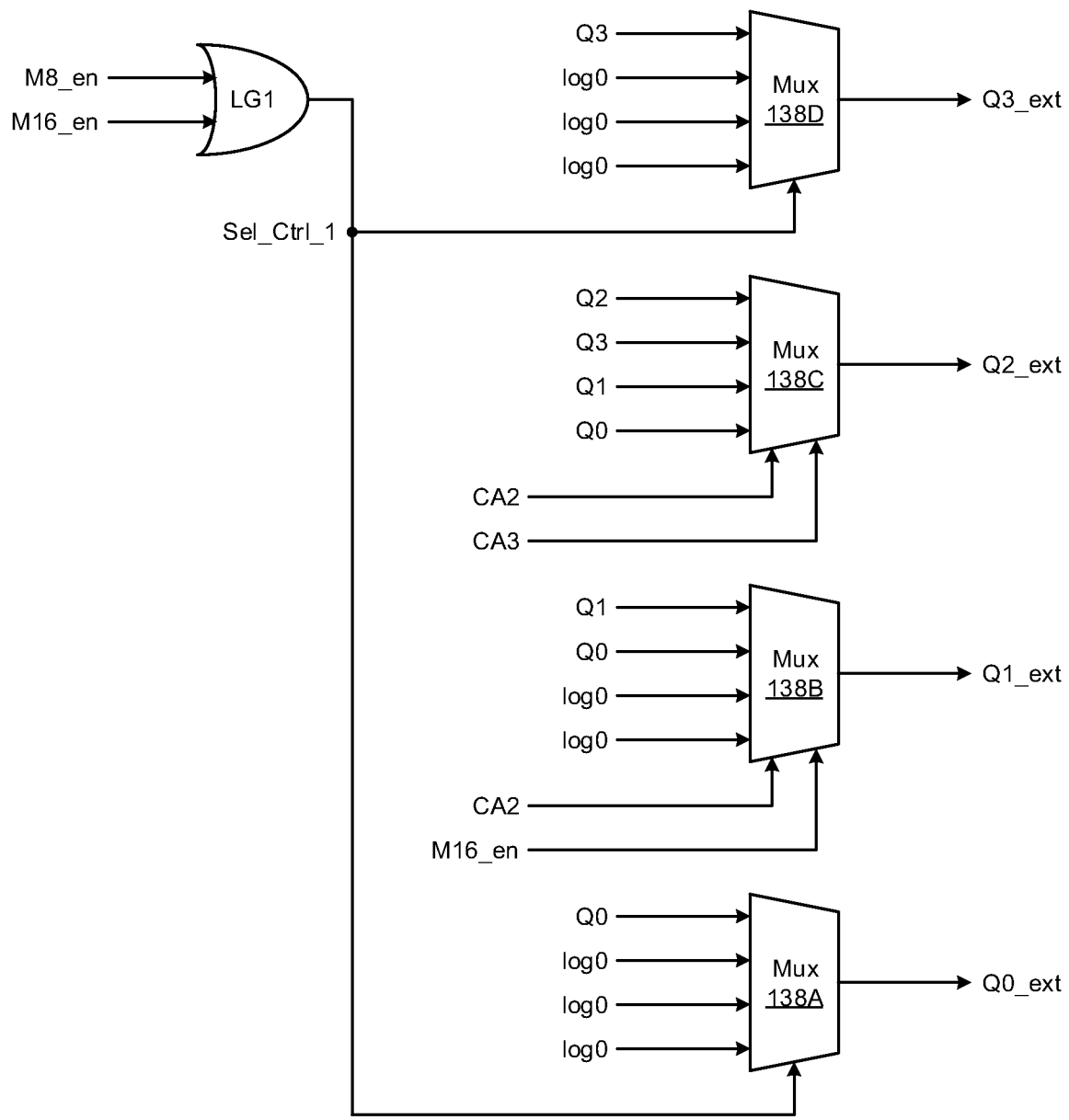
FIG. 2 illustrates a diagram of output interface circuitry in accordance with various implementations described herein.

As such, in some instances, the output interface circuitry 118 may be coupled to the output circuitry 108, and the output interface circuitry 118 may have a second set of multiplexers (e.g., Mux 138A, 138B, 138C, 138D, as shown in FIG. 2) that receives the first multiplexed output data (e.g., Q0, Q1, Q2, Q3) from the output circuitry 108 and also selectively provides second multiplexed output data (e.g., Q0_ext, Q1_ext, Q2_ext, Q3_ext) as external output data (e.g., that may be provided to an external device) based on a configurable mode of multiplexed operation.

In some instances, the first set of multiplexers (e.g., Q0, Q1, Q2, Q3) may refer to four multiplexers (mux4), and the first multiplexed output data may refer to mux4 output data that is provided by the output circuitry 108. Also, in some instances, the second set of multiplexers (e.g., Q0_ext, Q1_ext, Q2_ext, Q3_ext) may refer to four multiplexers, and the second multiplexed output data selectively provides mux4, mux8, or mux16 output data based on the configurable mode of multiplexed operation.

Therefore, in various instances, the configurable mode of multiplexed operation may refer to mux4, mux8, or mux16 operations. In some instances, the configurable mode of multiplexed operation may refer to a first configurable mode of multiplexed operation that is associated with a mux4 operation. In other instances, the configurable mode of multiplexed operation may refer to a second configurable mode of multiplexed operation that is associated with a mux8 operation. In still other instances, the configurable mode of multiplexed operation may refer to a third configurable mode of multiplexed operation that is associated with a mux16 operation.

In some implementations, various schemes and techniques described herein may provide for optimizing existing memory designs using a base multiplexer option, such as, e.g., mux4 that may be expanded to include mux8, mux16, or even larger. Further, in various implementations, the sizing of multiplexer capabilities may be selectively scalable for different sized memory macros, including mux8, mux16, or even larger.

FIG. 2 illustrates a diagram 200 of output interface circuitry 118 in accordance with various implementations described herein. Thus, the output interface circuitry 118 in FIG. 2 may be implemented as the Q_output interface circuitry 118 in FIG. 1.

As shown in FIG. 2, the output interface circuitry 118 may include the second set of multiplexers (Mux 138A, 138B, 138C, 138D) that are configured to receive the first multiplexed output data (Q0, Q1, Q2, Q3) from the output circuitry 108 in FIG. 1. Also, the second set of multiplexers (138A, 1386, 138C, 138D) may be configured to selectively provide the second multiplexed output data (Q0_ext, Q1_ext, Q2_ext, Q3_ext) as external output data (e.g., that may be provided to an external device) based on the configurable mode of multiplexed operation.

For instance, the output interface circuitry 118 may include a first multiplexer (Mux 138A) that is configured to receive the multiplexed output data (Q0) from the output circuitry 108 and also selectively provide the multiplexed output data (Q0_ext) as external output data (e.g., that may be provided to an external device) based on the configurable mode of multiplexed operation. In some instances, the first multiplexer (138A) may have multiple inputs (e.g., four inputs), wherein one of the inputs receives the multiplexed output data (Q0), and the other inputs are coupled to ground (e.g., log 0). The first multiplexer (138A) may also have a single output that is configured to provide the multiplexed output data (Q0_ext) as external output data. Further, in some instances, a first selection control signal (Set_Ctrl_1) may be coupled to the first multiplexer (138A) and used to select the input signal (Q0) for output as the multiplexed output data (Q0_ext).

Also, the output interface circuitry 118 may include a second multiplexer (Mux 138B) that is configured to receive the multiplexed output data (Q0, Q1) from the output circuitry 108 and also selectively provide the multiplexed output data (Q1_ext) as external output data (e.g., that may be provided to an external device) based on the configurable mode of multiplexed operation. In some instances, the second multiplexer (138B) may have multiple inputs (e.g., four inputs), wherein one of the inputs receives the multiplexed output data (Q1), another of the inputs receives the multiplexed output data (Q0), and the other inputs are coupled to ground (e.g., log 0). The second multiplexer (138B) may also have a single output that is configured to provide the multiplexed output data (Q1_ext) as external output data. Also, in some instances, a column address signal (CA2) and a Mux16 control signal (M16_en) may be coupled to the second multiplexer (138B), and these signals (CA2, M16_en) may be used to select the input signal (Q1) or the input signal (Q0) for output as the multiplexed output data (Q1_ext).

Also, the output interface circuitry 118 may include a third multiplexer (Mux 138C) that is configured to receive the multiplexed output data (Q0, Q1, Q2, Q3) from the output circuitry 108 and also selectively provide the multiplexed output data (Q2_ext) as external output data (e.g., that may be provided to an external device) based on the configurable mode of multiplexed operation. In some instances, the third multiplexer (138C) may have multiple inputs (e.g., four inputs), wherein one of the inputs receives the multiplexed output data (Q2), another of the inputs receives the multiplexed output data (Q3), another of the inputs receives the multiplexed output data (Q1), and another of the inputs receives the multiplexed output data (Q0). The third multiplexer (138C) may also have a single output that is configured to provide the multiplexed output data (Q2_ext) as external output data. Also, in some instances, a column address signal (CA2) and another column address signal (CA3) may be coupled to the third multiplexer (138C), and these signals (CA2, CA3) may be used to select one of the input signals (Q0, Q1, Q2, Q3) for output as the multiplexed output data (Q2_ext).

Further, the output interface circuitry 118 may include a fourth multiplexer (Mux 138D) that is configured to receive the multiplexed output data (Q3) from the output circuitry 108 and also selectively provide the multiplexed output data (Q3_ext) as external output data (e.g., that may be provided to an external device) based on the configurable mode of multiplexed operation. In some instances, the fourth multiplexer (138D) may have multiple inputs (e.g., four inputs), wherein one of the inputs receives the multiplexed output data (Q3), and the other inputs are coupled to ground (e.g., log 0). Also, the fourth multiplexer (138D) may have a single output that is configured to provide the multiplexed output data (Q3_ext) as external output data. In some instances, the first selection control signal (Sel_Ctrl_1) may be coupled to the fourth multiplexer (138D) and used to select the input signal (Q3) for output as the multiplexed output data (Q3_ext).

In some instances, the output interface circuitry 118 may include a selection control logic gate (LG1) that receives a mux8 enable signal (M8_en), receives a mux16 enable signal (M16_en), and provides the first selection control signal (Set_Ctrl_1) to the first multiplexer (138A) and the fourth multiplexer (138D). In some instances, the selection control logic gate (LG1) may refer to an OR gate; however, in various other instances, the logic gate (LG1) may use any type of logic gate that provides a similar output.

In various implementations, the output interface circuitry 118 may be selectively configured to provide mux4, mux8, or mux16 output data based on the configurable mode of multiplexed operation. Therefore, the configurable mode of multiplexed operation may refer to mux4, mux8, or mux16 operations. In some instances, the configurable mode of multiplexed operation may refer to a first configurable mode of multiplexed operation that is associated with a mux4 operation, which may use the first, second, third and fourth multiplexers (138A, 138B, 138C, 138D) to receive the input signals (Q0, Q1, Q2, Q3) and provide the multiplexed output data (Q0_ext, Q1_ext, Q2_ext, Q3_ext) based on output selection via the column address signals (CA2, CA3), the Mux16 control signal (M16_en), and also the first selection control signal (Sel_Ctrl_1). In some instances, with Mux4 enabled, all multiplexers (138A, 138B, 138C, 138D) may be enabled.

In some instances, the configurable mode of multiplexed operation may refer to a second configurable mode of multiplexed operation that is associated with a mux8 operation, which may use the second and third multiplexers (138B, 138C) to receive the input signals (Q0, Q1, Q2, Q3) and provide the multiplexed output data (Q1_ext, Q2_ext) based on output selection via the column address signals (CA2, CA3) along with the Mux16 control signal (M16_en). Also, for mux8 operation, the mux8 enable signal (M8_en) may be used to selectively enable Mux8 operation and provide the first selection control signal (Sel_Ctrl_1) to assist with Mux8 operation. In some instances, with Mux8 enabled, the multiplexers (138B, 138C) will be enabled while other multiplexers (138A, 138D) will have log 0 selected.

In some instances, the configurable mode of multiplexed operation may refer to a third configurable mode of multiplexed operation that is associated with a mux16 operation, which may use the third multiplexer (138C) to receive the input signals (Q0, Q1, Q2, Q3) and provide the multiplexed output data (Q0_ext, Q1_ext, Q2_ext, Q3_ext) via the output (Q2_ext) based on output selection via the column address signals (CA2, CA3), the Mux16 control signal (M16_en), and the first selection control signal (Sel_Ctrl_1). Also, for mux16 operation, the mux16 enable signal (M16_en) may be used to selectively enable Mux16 operation and provide the first selection control signal (Sel_Ctrl_1) to assist with Mux16 operation. In some instances, with Mux16 enabled, the third multiplexer (138C) will only be enabled while the other remaining multiplexers (138A, 138B, 138D) will have log 0 selected.

FIG. 3 illustrates a diagram 300 of an output truth table 302 in accordance with various implementations described herein. In some instances, the output truth table 302 refers to a Q_output truth table that is associated with selection of input/output signals for the output interface circuitry 118 described in FIG. 2.

As shown in FIG. 3, the output truth table 302 shows enable/disable signals for the various configurable modes of multiplexed operation. In various implementations, as described herein above, the output interface circuitry 118 may be selectively configured to provide for mux4, mux8, or mux16 output data based on a selected configurable mode of multiplexed operation. Therefore, in various implementations, the configurable mode of multiplexed operation may refer to mux4, mux8, or mux16 operations.

For instance, in reference to mux4 (M4) operation, the control signals (M8_en, M16_en, CA2, CA3) may be set to 4-bit logic zero (0000). Also, in this instance, the output interface circuitry 118 may be selectively configured to provide mux4 output data (Q0, Q1, Q2, Q3) via the multiplexed outputs (Q0_ext, Q1_ext, Q2_ext, Q3_ext) of the first, second, third and fourth multiplexers (138A, 138B, 138C, 138D), as shown in FIG. 2. Thus, the output interface circuitry 118 may be selectively configured for mux4 operation.

In another instance, in reference to mux8 (M8) operation, the control signals (M8_en, M16_en, CA2, CA3) may be set to first 4-bit logic (1010) or second 4-bit logic (1000). In this instance, with first 4-bit logic (1010), the output interface circuitry 118 may be selectively configured to provide mux8 output data (Q0, Q3) via the multiplexed outputs (Q0_ext, Q3_ext) of the first and fourth multiplexers (138A, 138D), as shown in FIG. 2. Also, in this instance, with second 4-bit logic (1000), the output interface circuitry 118 may be selectively configured to provide other mux8 output data (Q1, Q2) via the multiplexed outputs (Q1_ext, Q2_ext) of the second and third multiplexers (138B, 138C), as shown in FIG. 2. Therefore, the output interface circuitry 118 may also be selectively configured for mux8 operation.

Also, in another instance, in reference to mux16 (M16) operation, the control signals (M8_en, M16_en, CA2, CA3) may be set to first 4-bit logic (x111), second 4-bit logic (x110), third 4-bit logic (x101) or fourth 4-bit logic (x100). In this instance, with first 4-bit logic (x111), the output interface circuitry 118 may be selectively configured to provide mux16 output data (Q0) via the multiplexed output (Q2_ext) of the third multiplexer (138C), as shown in FIG. 2. Also, in this instance, with second 4-bit logic (x110), the output interface circuitry 118 may be selectively configured to provide mux16 output data (Q1) via the multiplexed output (Q2_ext) of the third multiplexer (138C), as shown in FIG. 2. Also, in this instance, with third 4-bit logic (x101), the output interface circuitry 118 may be selectively configured to provide mux16 output data (Q2) via the multiplexed output (Q2_ext) of the third multiplexer (138C), as shown in FIG. 2. Further, in this instance, with fourth 4-bit logic (x100), the output interface circuitry 118 may be selectively configured to provide mux16 output data (Q3) via the multiplexed output (Q2_ext) of the third multiplexer (138C), as shown in FIG. 2. Therefore, the output interface circuitry 118 may also be selectively configured for mux16 operation.

Figure 4:
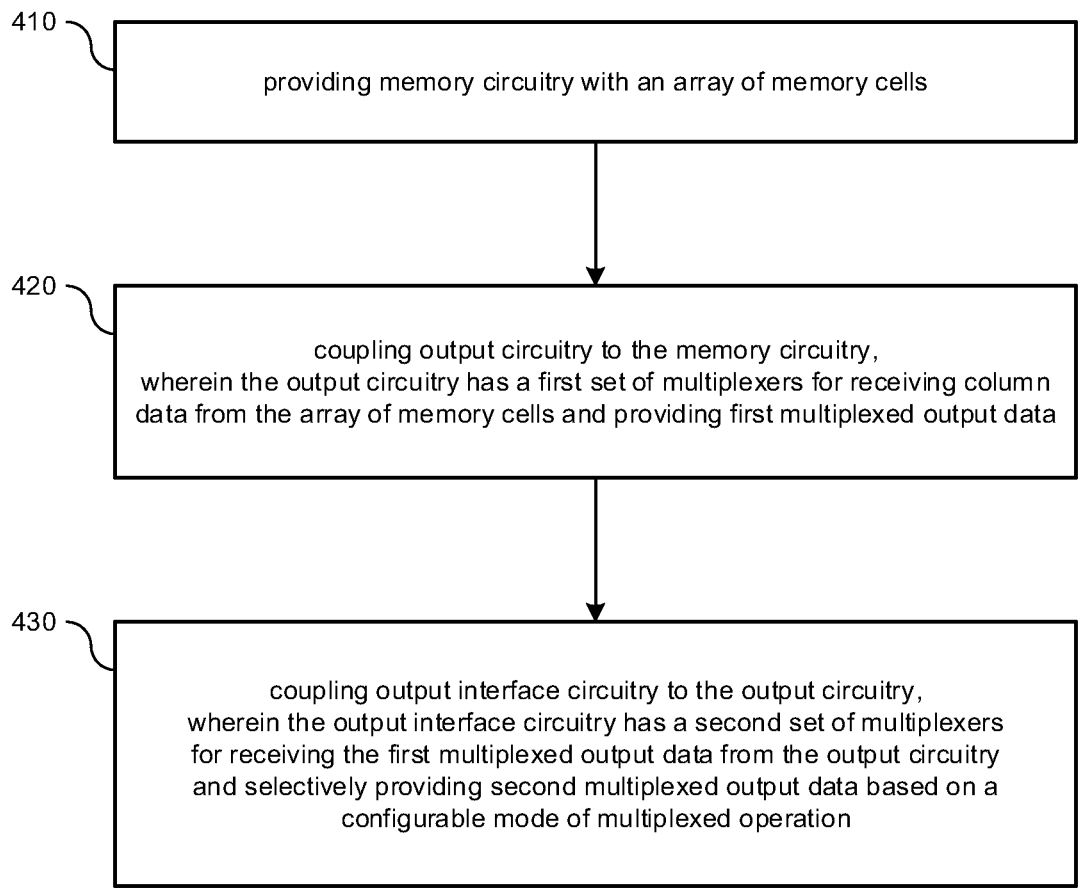
FIG. 4 illustrates a process diagram of a method for providing configurable output multiplexing circuitry in accordance with implementations described herein.

FIG. 4 illustrates a diagram 400 of a method 402 for providing configurable output multiplexing circuitry in accordance with implementations described herein.

It should be understood that even though method 400 indicates a particular order of operation execution, in some cases, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, method 400 may be implemented as a program and/or software instruction process configured for providing various configurable multiplexing schemes and techniques, as described herein. Also, if implemented in software, instructions related to implementing method 400 may be stored in memory and/or a database. For instance, various types of computing devices having a processor and memory may be configured to perform method 400.

In various implementations, method 400 may refer to a method of designing, providing, building, fabricating and/or manufacturing configurable multiplexing circuitry as an integrated system, device and/or circuit that may involve use of the various IC circuit components described herein so as to implement configurable multiplexing schemes and techniques associated therewith. In some implementations, the configurable multiplexing circuitry may be integrated with computing circuitry and related components on a single chip, and the configurable multiplexing circuitry may be implemented in various embedded systems for various electronic, mobile and Internet-of-things (IoT) applications.

At block 410, method 400 may be configured to provide memory circuitry with an array of memory cells. In some instances, the memory circuitry may refer to mux4 memory circuitry having the array of memory cells configured to provide the column data to the output circuitry.

At block 420, method 400 may couple output circuitry to the memory circuitry, and the output circuitry may have a first set of multiplexers for receiving column data from the array of memory cells and for providing first multiplexed output data. The first set of multiplexers may include four multiplexers, and also, the first multiplexed output data may provide mux4 output data.

At block 430, method 400 may couple output interface circuitry to the output circuitry, and also, the output interface circuitry may have a second set of multiplexers for receiving the first multiplexed output data from the output circuitry and for selectively providing second multiplexed output data based on a configurable mode of multiplexed operation. The second set of multiplexers may have four multiplexers, and the second multiplexed output data may selectively provide mux4, mux8, or mux16 output data.

In various instances, the configurable mode of multiplexed operation may refer to a first configurable mode, a second configurable mode, or a third configurable mode of multiplexed operation. For instance, the first configurable mode of multiplexed operation may be associated with a mux4 operation, the second configurable mode of multiplexed operation may be associated with a mux8 operation, and the third configurable mode of multiplexed operation may be associated with a mux16 operation.

Figure 5:
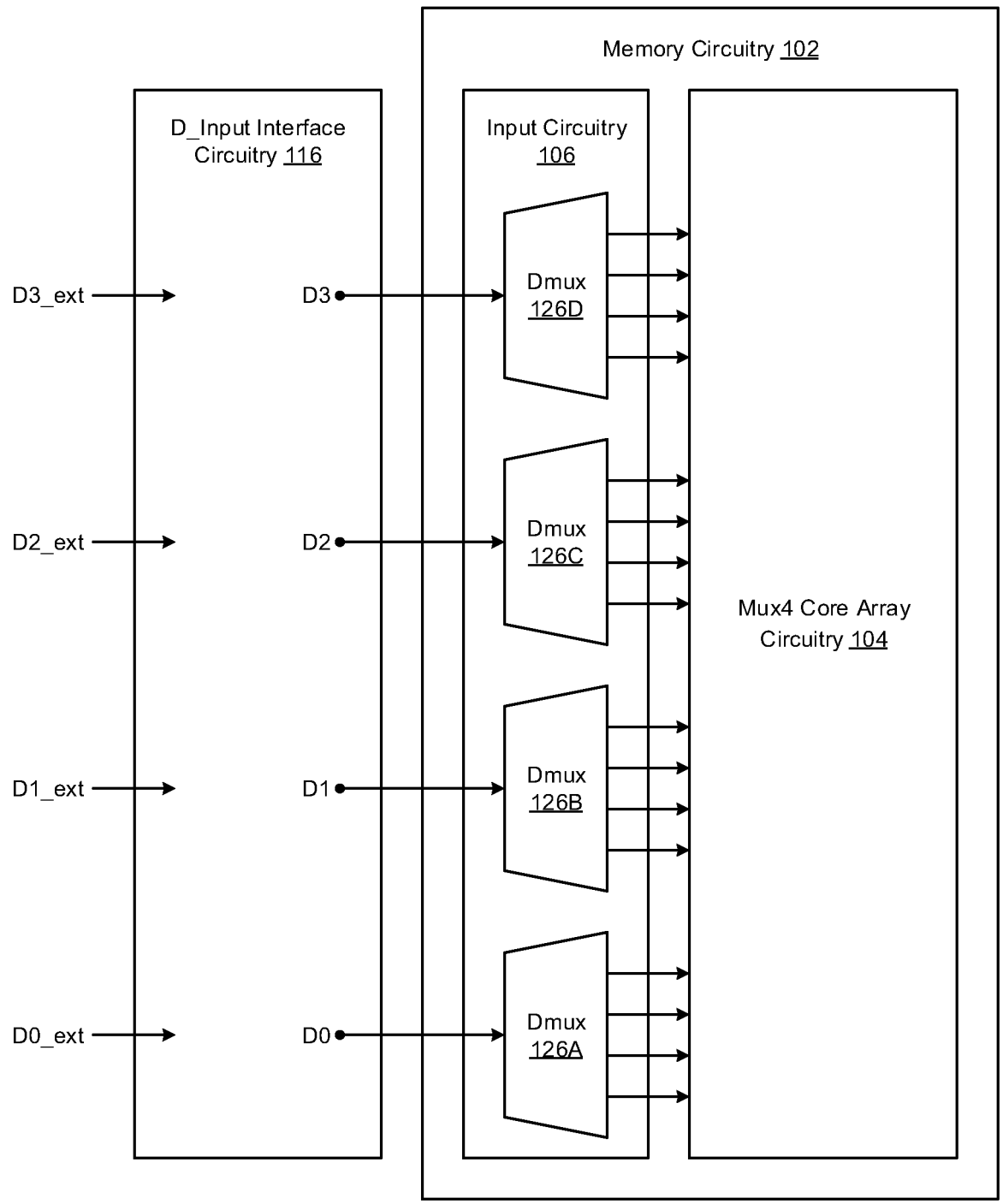
FIG. 5 illustrates a diagram of memory circuitry with input interface circuitry in accordance with various implementations described herein.

FIG. 5 illustrates another diagram 500 of the memory circuitry 102 with input interface circuitry 106 in accordance with implementations described herein.

As shown in FIG. 5, the memory circuitry 102 includes the core array circuitry 104 having an array of memory cells (or bitcells) arranged in columns and rows. In some instances, the memory circuitry 102 may include mux4 core array circuitry, and also, the memory circuitry 102 may refer to mux4 memory circuitry having the core array of memory cells 104 configured to provide column data to the output circuitry 108. Thus, the memory circuitry 102 along with the core array 104 in FIG. 5 are similar to (or the same as) the memory circuitry 102 along with the core array 104 in FIG. 1.

In some instances, the memory circuitry 102 may refer to memory architecture having the core array circuitry 104 along with column multiplexer circuitry, such as, e.g., input circuitry 106 that is coupled to the memory architecture via the multiple bitlines for write access operations. Also, as shown in FIG. 5, the input circuitry 106 may be coupled to the memory circuitry 102, and the input interface circuitry 116 may be coupled to the input circuitry 106. As described herein, the memory circuitry 102 may include mux4 core array circuitry, and also, the memory circuitry 102 may refer to mux4 memory circuitry having the core array 104 of memory cells that are configured to store multiplexed input data that is received from the input circuitry 106.

Figure 6:
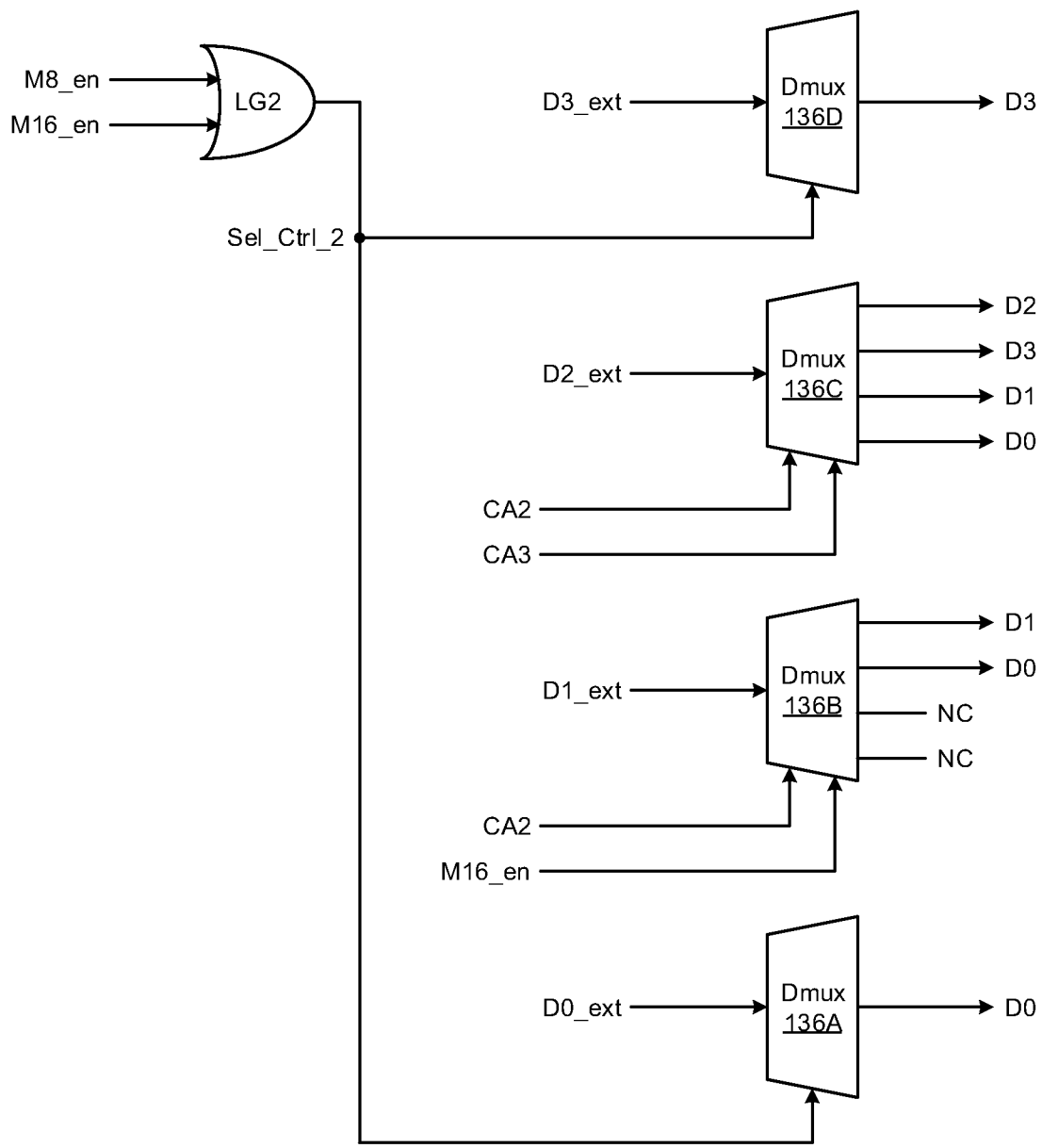
FIG. 6 illustrates a diagram of input interface circuitry in accordance with various implementations described herein.

In some instances, the input interface circuitry 116 may include a first set of multiplexers (e.g., Dmux 136A, 136B, 136C, 136D, as shown in FIG. 6) that receives input data (e.g., D0_ext, D1_ext, D2_ext, D3_ext) from an external data source and selectively provides first multiplexed input data (e.g., D0, D1, D2, D3) to the input circuitry 106 based on a configurable mode of multiplexed operation. Also, the input circuitry 106 may include a second set of multiplexers (e.g., Dmux 126A, 126B, 126C, 126D) that receives the first multiplexed input data (e.g., D0, D1, D2, D3) from the input interface circuitry 116 and provides second multiplexed input data to the memory core array circuitry 104.

In some instances, the first set of multiplexers (e.g., Dmux 136A, 136B, 136C, 136D, as shown in FIG. 6) may include four multiplexers (e.g., four multiplexers in mux4 mode), and the first multiplexed input data (e.g., D0, D1, D2, D3) selectively provides mux4, mux8, or mux16 input data to the input circuitry 106. Also, in some instances, the second set of multiplexers (e.g., Dmux 126A, 126B, 126C, 126D) may have four multiplexers (e.g., four multiplexers in mux4 mode), and the second multiplexed input data may provide mux4 input data to the core array circuitry 104.

Therefore, in various instances, the configurable mode of a multiplexed operation may refer to mux4, mux8, or mux16 operations. In some instances, the configurable mode of multiplexed operation may refer to a first configurable mode of multiplexed operation that is associated with a mux4 operation. In other instances, the configurable mode of multiplexed operation may refer to a second configurable mode of multiplexed operation that is associated with a mux8 operation. In still other instances, the configurable mode of multiplexed operation may refer to a third configurable mode of multiplexed operation that is associated with a mux16 operation.

In some implementations, various schemes and techniques described herein may provide for optimizing existing memory designs using a base multiplexer option, such as, e.g., mux4 that may be expanded to include mux8, mux16, or even larger. Further, in various implementations, the sizing of multiplexer capabilities may be selectively scalable for different sized memory macros, including include mux8, mux16, or even larger.

FIG. 6 illustrates a diagram 600 of input interface circuitry 116 in accordance with various implementations described herein. Thus, the input interface circuitry 116 in FIG. 6 may be implemented as the D_input interface circuitry 116 in FIG. 5.

As shown in FIG. 6, the input interface circuitry 116 may include the first set of multiplexers (Dmux 136A, 136B, 136C, 136D) that are configured to receive input data (D0_ext, D1_ext, D2_ext, D3_ext) from an external data source. Also, in some instances, the first set of multiplexers (Dmux 136A, 136B, 136C, 136D) may be configured to selectively provide the first multiplexed output data (D0, D1, D2, D3) as the second multiplexed output data (e.g., that may be provided to the input circuitry 106 of the memory circuitry 102 in FIG. 1) based on the configurable mode of multiplexed operation.

For instance, the input interface circuitry 116 may include a first multiplexer (Dmux 136A) that is configured to receive the input data (D0_ext) from the external data source and selectively provide the multiplexed input data (DO) to the input circuitry 106 in FIG. 1 based on the configurable mode of multiplexed operation. In some instances, the first multiplexer (136A) may have a single input that is configured to receive the input data (D0_ext) as external input data. Also, the first multiplexer (136A) may have multiple outputs (e.g., four outputs), wherein one of the outputs may be selected to provide the multiplexed input data (DO), and the other outputs are floating (e.g., float). Further, a second selection control signal (Sel_Ctrl_2) may be coupled to the first multiplexer (136A) and used to select the input signal (D0_ext) for output as the multiplexed input data (D0). In some instances, Dmux 136A may refer to a tri-state buffer (having single input to single output), which may have a single input pin to control 1:1, Sel_Ctrl_2 is zero, and D0_ext will appear at D0 (mux4 only), else D0 from Dmux 136A will float (for mux8 and mux16).

Also, the input interface circuitry 116 may include a second multiplexer (Dmux 136B) that is configured to receive the input data (D1_ext) from the external data source and also selectively provide the multiplexed input data (D0, D1) to the input circuitry 106 in FIG. 1 based on the configurable mode of multiplexed operation. In some instances, the second multiplexer (136B) may have a single input that is configured to receive the input data (D1_ext) as external input data. Also, the second multiplexer (136B) may have multiple outputs (e.g., four outputs), wherein one of the outputs provides the multiplexed input data (D1), another of the outputs provides the multiplexed input data (D0), and the other outputs are not connected (e.g., NC or floating). Further, in some instances, the column address signal (CA2) and the Mux16 control signal (M16_en) may be coupled to the second multiplexer (136B), and these signals (CA2, M16_en) may be used to select the input signal (D1_ext) for output as the multiplexed input data (D0, D1). In some instances, Dmux 136B may be enabled for Mux4 or Mux8 only. For Mux4, D1_ext may appear to D1 (as both CA2 and M16_en will be zero). For Mux8, D1_ext may appear to D1 or D0 based on CA2 (0 or 1) as M16_en will be zero.

Also, the input interface circuitry 116 may include a third multiplexer (Dmux 136C) that is configured to receive the input data (D2_ext) from the external data source and selectively provide the multiplexed input data (D0, D1, D2, D3) to the input circuitry 106 in FIG. 1 based on the configurable mode of multiplexed operation. In some instances, the third multiplexer (136C) may have a single input that is configured to receive the input data (D2_ext) as external input data. The second multiplexer (136B) may have multiple outputs (e.g., four outputs), wherein one of the outputs provides the multiplexed input data (D2), another output provides the multiplexed input data (D3), another output provides the multiplexed input data (D1), and another output provides the multiplexed input data (D0). Further, in some instances, the column address signals (CA2, CA3) may be coupled to the third multiplexer (136C), and these signals (CA2, CA3) may be used to select the input signal (D2_ext) for output as the multiplexed input data (D0, D1, D2, D3). In various instances, Dmux 136C may be enabled for all mux4, mux8 and mux16 operations, in accordance with the truth table 702 in FIG. 7.

Further, the input interface circuitry 116 may include a fourth multiplexer (Dmux 136D) that is configured to receive the input data (D3_ext) from the external data source and selectively provide the multiplexed input data (D3) to the input circuitry 106 in FIG. 1 based on the configurable mode of multiplexed operation. In some instances, the fourth multiplexer (136D) may have a single input that is configured to receive the input data (D3_ext) as external input data. The fourth multiplexer (136D) may have multiple outputs (e.g., four outputs), wherein one of the outputs provides the multiplexed input data (D3), and the other outputs are floating (e.g., float). Also, the second selection control signal (Set_Ctrl_2) may be coupled to the fourth multiplexer (136D) and used to select the input signal (D3_ext) for output as the multiplexed input data (D3). In some instances, Dmux 136D may refer to a tri-state buffer (having single input to single output), which may have a single input pin to control 1:1, Sel_Ctrl_2 is zero, and D3_ext will appear at D3 (mux4 only), else D3 from Dmux 136D will float (for mux8 and mux16).

In some instances, the input interface circuitry 116 includes a selection control logic gate (LG2) that is configured to receive the mux8 enable signal (M8_en), receive the mux16 enable signal (M16_en), and then provide the second selection control signal (Sel_Ctrl_2) to the first multiplexer (Dmux 136A) and the fourth multiplexer (Dmux 136D). Further, in some instances, the selection control logic gate (LG2) may refer to an OR gate; however, in various other instances, the logic gate (LG2) may be configured to use any other type of logic gate that provides a similar output.

In various implementations, the input interface circuitry 116 may be selectively configured to receive mux4, mux8, or mux16 input data based on the configurable mode of multiplexed operation. Therefore, the configurable mode of multiplexed operation may refer to mux4, mux8, or mux16 operations. In some instances, the configurable mode of multiplexed operation may refer to a first configurable mode of multiplexed operation that is associated with a mux4 operation, which may use the first, second, third and fourth multiplexers (Dmux 136A, 136B, 136C, 136D) to receive the input signals (D0_ext, D1_ext, D2_ext, D3_ext) and provide the multiplexed input data (D0, D1, D2, D3) based on input selection via the column address signals (CA2, CA3), the Mux16 control signal (M16_en), and also the second selection control signal (Sel_Ctrl_2).

In some instances, the configurable mode of multiplexed operation may refer to a second configurable mode of multiplexed operation that is associated with a mux8 operation, which may use the second and third multiplexers (Dmux 136B, 136C) to receive the input signals (D1_ext, D2_ext) and provide the multiplexed input data (D0, D1, D2, D3) based on output selection via the column address signals (CA2, CA3) along with the Mux16 control signal (M16_en). Also, for mux8 operation, the mux8 enable signal (M8_en) may be used to selectively enable Mux8 operation and provide the second selection control signal (Sel_Ctrl_2) to assist with Mux8 operation.

In some instances, the configurable mode of multiplexed operation may refer to a third configurable mode of multiplexed operation that is associated with a mux16 operation, which may use the third multiplexer (Dmux 136C) to receive the input signal (D2_ext) and provide the multiplexed input data (D0, D1, D2, D3) via the input (D2_ext) based on input selection via the column address signals (CA2, CA3), Mux16 control signal (M16_en), and second selection control signal (Sel_Ctrl_2). Also, for mux16 operation, the mux16 enable signal (M16_en) may be used to selectively enable Mux16 operation and provide the second selection control signal (Sel_Ctrl_2) to assist with Mux16 operation.

FIG. 7 illustrates a diagram 700 of an input truth table 702 in accordance with various implementations described herein. In some instances, the input truth table 702 refers to a D_input truth table that is associated with selection of input/output signals for the input interface circuitry 116 described in FIG. 6.

As shown in FIG. 7, the input truth table 702 shows enable/disable signals for the various configurable modes of multiplexed operation. In various implementations, as described herein above, the input interface circuitry 116 may be selectively configured to provide for mux4, mux8, or mux16 input data based on a selected configurable mode of multiplexed operation. Therefore, in various implementations, the configurable mode of multiplexed operation may refer to mux4, mux8, or mux16 operations.

For instance, in reference to mux4 (M4) operation, the control signals (M8_en, M16_en, CA2, CA3) may be set to 4-bit logic zero (0000). Also, in this instance, the input interface circuitry 116 may be selectively configured to receive mux4 input data (D0_ext, D1_ext, D2_ext, D3_ext) via input (D2_ext) of the third multiplexer (Dmux 136) and then provide the multiplexed input signals (D0, D1, D2, D3) to the input circuitry 106 of the memory circuitry 102, as shown in FIG. 6. Therefore, the input interface circuitry 116 may be selectively configured for mux4 operation.

In another instance, in reference to mux8 (M8) operation, the control signals (M8_en, M16_en, CA2, CA3) may be set to first 4-bit logic (1010) or second 4-bit logic (1000). In this instance, with first 4-bit logic (1010), the input interface circuitry 116 may be selectively configured to receive mux8 input data (D0_ext, D3_ext) via inputs (D1_ext, D2_ext) of the second and third multiplexers (Dmux 136B, 136C) and provide the multiplexed input signals (D0, D3) to the input circuitry 106 of the memory circuitry 102, as shown in FIG. 6. Also, in this instance, with second 4-bit logic (1000), the input interface circuitry 116 may be selectively configured to receive mux8 input data (D1_ext, D2_ext) via inputs (D1_ext, D2_ext) of the second and third multiplexers (Dmux 136B, 136C) and then provide the multiplexed input signals (D1, D2) to the input circuitry 106 of the memory circuitry 102, as shown in FIG. 6. Therefore, the input interface circuitry 116 may also be selectively configured for mux8 operation.

Also, in another instance, in reference to mux16 (M16) operation, the control signals (M8_en, M16_en, CA2, CA3) may be set to first 4-bit logic (x111), second 4-bit logic (x110), third 4-bit logic (x101) or fourth 4-bit logic (x100). In this instance, with first 4-bit logic (x111), the input interface circuitry 116 may be selectively configured to receive mux16 input data (D0_ext) via the multiplexed input (D0_ext) of the first multiplexer (Dmux 136A) and provide the multiplexed input signal (D0) to the input circuitry 106, as shown in FIG. 6. Also, in this instance, with second 4-bit logic (x110), the input interface circuitry 116 may be selectively configured to provide mux16 input data (D3_ext) via the multiplexed input (D3_ext) of the fourth multiplexer (Dmux 136D) and provide the multiplexed input signal (D3) to the input circuitry 106, as shown in FIG. 6. Also, in this instance, with third 4-bit logic (x101), the input interface circuitry 116 may be selectively configured to provide mux16 input data (D1_ext) via the multiplexed input (D1_ext) of the second multiplexer (Dmux 1366) and provide the multiplexed input signal (D1) to the input circuitry 106, as shown in FIG. 6. Further, in this instance, with fourth 4-bit logic (x100), the input interface circuitry 116 may be selectively configured to provide mux16 input data (D2_ext) via the multiplexed input (D2_ext) of the third multiplexer (Dmux 136C) and provide the multiplexed input signal (D2) to the input circuitry 106, as shown in FIG. 6. Thus, the input interface circuitry 116 may also be selectively configured for mux16 operation.

Figure 8:
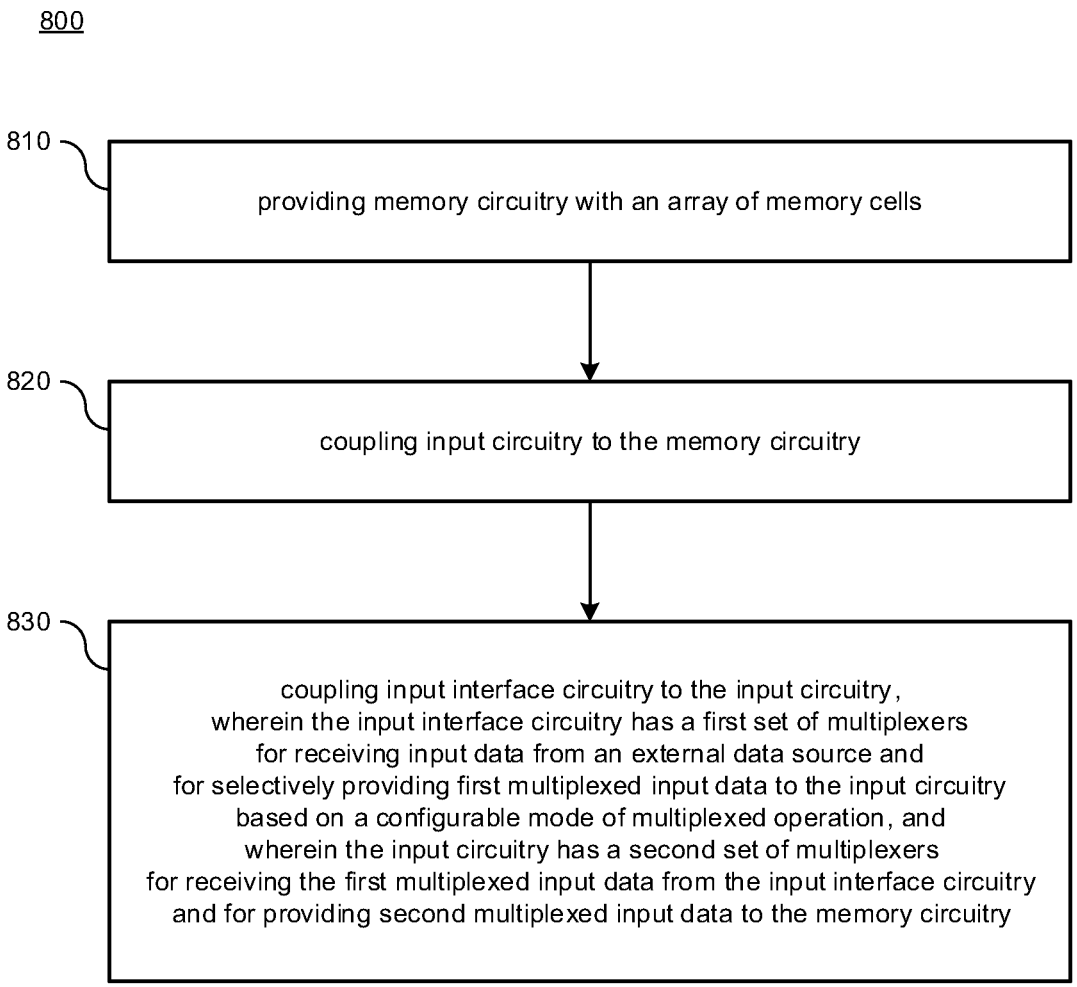
FIG. 8 illustrates a process diagram of a method for providing configurable input multiplexing circuitry in accordance with implementations described herein.

FIG. 8 illustrates a diagram 800 of a method 802 for providing configurable input multiplexing circuitry in accordance with implementations described herein.

It should be understood that even though method 800 indicates a particular order of operation execution, in some cases, various certain portions of the operations may be executed in a different order, and on different systems. In other cases, additional operations and/or steps may be added to and/or omitted from method 800. Also, method 800 may be implemented in hardware and/or software. If implemented in hardware, the method 800 may be implemented with various components and/or circuitry, as described herein in reference to FIGS. 5-7. Also, if implemented in software, method 800 may be implemented as a program and/or software instruction process configured for providing various configurable multiplexing schemes and techniques, as described herein. Also, if implemented in software, instructions related to implementing method 800 may be stored in memory and/or a database. For instance, various types of computing devices having a processor and memory may be configured to perform method 800.

In various implementations, method 800 may refer to a method of designing, providing, building, fabricating and/or manufacturing configurable multiplexing circuitry as an integrated system, device and/or circuit that may involve use of the various IC circuit components described herein so as to implement configurable multiplexing schemes and techniques associated therewith. In some implementations, the configurable multiplexing circuitry may be integrated with computing circuitry and related components on a single chip, and the configurable multiplexing circuitry may be implemented in various embedded systems for various electronic, mobile and Internet-of-things (IoT) applications.

At block 810, method 800 may be configured to provide memory circuitry with an array of memory cells. In some instances, the memory circuitry may refer to mux4 memory circuitry having the array of memory cells that are configured to store the second multiplexed input data from the input circuitry. At block 820, method 800 may couple input circuitry to the memory circuitry.

Also, at block 830, method 800 may couple input interface circuitry to the input circuitry. The input interface circuitry may have a first set of multiplexers for receiving input data from an external data source and for selectively providing first multiplexed input data to the input circuitry based on a configurable mode of multiplexed operation. Also, the input circuitry may have a second set of multiplexers for receiving the first multiplexed input data from the input interface circuitry and for providing second multiplexed input data to the memory circuitry.

In some instances, the first set of multiplexers may include four multiplexers, and the first multiplexed input data may selectively provide mux4, mux8, or mux16 input data to the second set of multiplexers of the input circuitry. In addition, in some instances, the second set of multiplexers may include four multiplexers, and the second multiplexed input data may provide mux4 input data to the memory circuitry.

In various instances, the configurable mode of multiplexed operation may refer to a first configurable mode, a second configurable mode, or a third configurable mode of multiplexed operation. For instance, the first configurable mode of multiplexed operation may be associated with a mux4 operation, the second configurable mode of multiplexed operation may be associated with a mux8 operation, and the third configurable mode of multiplexed operation may be associated with a mux16 operation.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include memory circuitry having an array of memory cells. The device may include output circuitry coupled to the memory circuitry, and the output circuitry may have a first set of multiplexers that receives column data from the array of memory cells and provides first multiplexed output data. The device may include output interface circuitry coupled to the output circuitry, and the output interface circuitry may have a second set of multiplexers that receives the first multiplexed output data from the output circuitry and selectively provides second multiplexed output data based on a configurable mode of multiplexed operation.

Described herein are various implementations of a device. The device may include memory circuitry having an array of memory cells. The device may include input circuitry coupled to the memory circuitry. The device may include input interface circuitry coupled to the input circuitry. The input interface circuitry may have a first set of multiplexers that receives input data from an external data source and selectively provides first multiplexed input data to the input circuitry based on a configurable mode of multiplexed operation. The input circuitry may have a second set of multiplexers that receives the first multiplexed input data from the input interface circuitry and provides second multiplexed input data to the memory circuitry.

Described herein are various implementations of a method. The method may include providing memory circuitry with an array of memory cells, coupling input circuitry to the memory circuitry, and coupling input interface circuitry to the input circuitry. The input interface circuitry may have a first set of multiplexers for receiving input data from an external data source and for selectively providing first multiplexed input data to the input circuitry based on a configurable mode of multiplexed operation. The input circuitry may have a second set of multiplexers for receiving the first multiplexed input data from the input interface circuitry and for providing second multiplexed input data to the memory circuitry.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A device, comprising:
memory circuitry having an array of memory cells;
output circuitry coupled to the memory circuitry, wherein the output circuitry has a first set of 4-to-1 multiplexers that receives column data from the array of memory cells and provides first multiplexed output data including first output data, second output data, third output data and fourth output data; and
output interface circuitry coupled directly to the output circuitry, wherein the output interface circuitry has a second set of 4-to-1 multiplexers that receives the first multiplexed output data directly from the first set of multiplexers of the output circuitry and selectively provides second multiplexed output data based on a configurable mode of multiplexed operation, wherein:
a first 4-to-1 multiplexer in the second set receives only the first output data from the first set,
a second 4-to-1 multiplexer in the second set receives only the first output data and the second output data from the first set,
a third 4-to-1 multiplexer in the second set receives only the first output data, the second output data, the third output data and the fourth output data from the first set, and
a fourth 4-to-1 multiplexer in the second set receives only the fourth output data from the first set.

2. The device of claim 1, wherein the first set of 4-to-1 multiplexers has four 4-to-1 multiplexers.

3. The device of claim 1, wherein the second set of 4-to-1 multiplexers has four 4-to-1 multiplexers, including the first 4-to-1 multiplexer, the second 4-to-1 multiplexer, the third 4-to-1 multiplexer and the fourth 4-to-1 multiplexer.

4. The device of claim 1, wherein the configurable mode of multiplexed operation refers to a first configurable mode of multiplexed operation that provides first configurable output data.

5. The device of claim 4, wherein the configurable mode of multiplexed operation refers to a second configurable mode of multiplexed operation that provides second configurable output data that is different from the first configurable output data.

6. The device of claim 5, wherein the configurable mode of multiplexed operation refers to a third configurable mode of multiplexed operation that provides third configurable output data that is different from the first configurable output data and the second configurable output data.

7. A method, comprising:
providing memory circuitry with an array of memory cells;
coupling output circuitry to the memory circuitry, wherein the output circuitry has a first set of 4-to-1 multiplexers for receiving column data from the array of memory cells and for providing first multiplexed output data including first output data, second output data, third output data and fourth output data; and
coupling output interface circuitry directly to the output circuitry, wherein the output interface circuitry has a second set of 4-to-1 multiplexers for receiving the first multiplexed output data directly from the first set of multiplexers of the output circuitry, and for selectively providing second multiplexed output data based on a configurable mode of multiplexed operation, and wherein:
a first 4-to-1 multiplexer in the second set receives only the first output data from the first set,
a second 4-to-1 multiplexer in the second set receives only the first output data and the second output data from the first set,
a third 4-to-1 multiplexer in the second set receives only the first output data, the second output data, the third output data and the fourth output data from the first set, and
a fourth 4-to-1 multiplexer in the second set receives only the fourth output data from the first set.

8. The method of claim 7, wherein:
the first set of 4-to-1 multiplexers has four 4-to-1 multiplexers, and
the second multiplexed output data comprises the second output data that is different from the first output data.

9. The method of claim 7, wherein the configurable mode of multiplexed operation refers to at least one of:
a first configurable mode that provides first configurable output data,
a second configurable mode that provides second configurable output data that is different from the first configurable output data, and
a third configurable mode that provides third configurable output data that is different from the first configurable output data and the second configurable output data.

10. A device, comprising:
memory circuitry having an array of memory cells;
input circuitry coupled to the memory circuitry; and
input interface circuitry coupled to the input circuitry,
wherein the input interface circuitry has a first set of 1-to-4 multiplexers that receives input data from an external data source and selectively provides first multiplexed input data to the input circuitry based on a configurable mode of multiplexed operation, the first multiplexed input data including first input data, second input data, third input data and fourth input data,
wherein the input circuitry has a second set of 1-to-4 multiplexers that receives the first multiplexed input data directly from the first set of multiplexers of the input interface circuitry and provides second multiplexed input data to the memory circuitry, and
wherein:
a first 1-to-4 multiplexer in the first set provides only the first input data to the second set,
a second 1-to-4 multiplexer in the first set provides only the first input data and the second input data to the second set,
a third 1-to-4 multiplexer in the first set provides only the first input data, the second input data, the third input data and the fourth input data to the second set, and
a fourth 1-to-4 multiplexer in the first set provides only the fourth input data to the second set.

11. The device of claim 10, wherein the first second set of 1-to-4 multiplexers has four 1-to-4 multiplexers.

12. The device of claim 10, wherein the second first set of 1-to-4 multiplexers has four 1-to-4 multiplexers, including the first 1-to-4 multiplexer, the second 1-to-4 multiplexer, the third 1-to-4 multiplexer and the fourth 1-to-4 multiplexer.

13. The device of claim 10, wherein the configurable mode of multiplexed operation refers to a first configurable mode of multiplexed operation that provides first configurable input data to the memory circuitry.

14. The device of claim 13, wherein the configurable mode of multiplexed operation refers to a second configurable mode of multiplexed operation that provides second configurable input data to the memory circuitry, the second configurable input data being different from the first configurable input data.

15. The device of claim 14, wherein the configurable mode of multiplexed operation refers to a third configurable mode of multiplexed operation that provides third configurable input data to the memory circuitry, the third configurable input data being different from the first configurable input data and the second configurable input data.

16. The device of claim 10, wherein the array of memory cells is configured to store the second multiplexed input data from the input circuitry.

17. A method, comprising:
providing memory circuitry with an array of memory cells;
coupling input circuitry to the memory circuitry; and
coupling input interface circuitry directly to the input circuitry,
wherein the input interface circuitry has a first set of 1-to-4 multiplexers for receiving input data from an external data source and for selectively providing first multiplexed input data directly to a second set of 1-to-4 multiplexers of the input circuitry based on a configurable mode of multiplexed operation including first input data, second input data, third input data and fourth input data,
wherein the input circuitry has the second set of 1-to-4 multiplexers for receiving the first multiplexed input data directly from the first set of 1-to-4 multiplexers of the input interface circuitry and for providing second multiplexed input data to the memory circuitry, and wherein:
a first 1-to-4 multiplexer in the first set provides only the first input data to the second set,
a second 1-to-4 multiplexer in the first set provides only the first input data and the second input data to the second set,
a third 1-to-4 multiplexer in the first set provides only the first input data, the second input data, the third input data and the fourth input data to the second set, and
a fourth 1-to-4 multiplexer in the first set provides only the fourth input data to the second set.

18. The method of claim 17, wherein:
the first set of 1-to-4 multiplexers has four 1-to-4 multiplexers, including the first 1-to-4 multiplexer, the second 1-to-4 multiplexer, the third 1-to-4 multiplexer and the fourth 1-to-4 multiplexer,
the first set of 1-to-4 multiplexers selectively provides first configurable input data to the second set of 1-to-4 multiplexers,
the second set of 1-to-4 multiplexers has four 1-to-4 multiplexers, and
the second set of 1-to-4 multiplexers provides second configurable input data to the memory circuitry.

19. The method of claim 17, wherein the configurable mode of multiplexed operation refers to at least one of:
a first configurable mode that provides first configurable input data to the memory circuitry,
a second configurable mode that provides second configurable input data to the memory circuitry, the second configurable input data being that is different from the first configurable input data, and
a third configurable mode that provides third configurable input data to the memory circuitry, the third configurable input data being different from the first configurable data and the second configurable input data.

* * * * *